US007304482B1

(12) United States Patent
Kay et al.

(10) Patent No.: US 7,304,482 B1
(45) Date of Patent: Dec. 4, 2007

(54) CHARACTERIZATION OF THE NONLINEARITIES OF A DISPLAY DEVICE BY ADAPTIVE BISECTION WITH CONTINUOUS USER REFINEMENT

(76) Inventors: Robert L. Kay, 4601 Boulder Run, Fort Worth, TX (US) 76109-3217; Carl Brock Brandenberg, 3050 Bellaire Ranch Rd., #826, Fort Worth, TX (US) 76109

( * ) Notice: Subject to any disclaimer, the term of this patent is extended or adjusted under 35 U.S.C. 154(b) by 435 days.

(21) Appl. No.: 10/728,481

(22) Filed: Dec. 4, 2003

Related U.S. Application Data

(60) Provisional application No. 60/431,490, filed on Dec. 4, 2002.

(51) Int. Cl.

| | |
|---|---|
| ***G01R 27/28*** | (2006.01) |
| ***G01R 31/00*** | (2006.01) |
| ***G06T 11/00*** | (2006.01) |
| ***G09G 5/00*** | (2006.01) |
| ***G06K 9/32*** | (2006.01) |
| ***G01D 3/02*** | (2006.01) |

(52) U.S. Cl. ...................... 324/615; 345/469; 345/586; 382/300; 324/770; 702/109

(58) Field of Classification Search ............... 345/469, 345/586; 702/109

See application file for complete search history.

(56) References Cited

U.S. PATENT DOCUMENTS

| | | | | |
|---|---|---|---|---|
| 4,831,598 | A * | 5/1989 | Koike et al. | 367/7 |
| 5,933,549 | A * | 8/1999 | Ide et al. | 382/309 |
| 6,433,840 | B1 * | 8/2002 | Poppleton | 348/745 |
| 6,529,197 | B1 * | 3/2003 | Ballard et al. | 345/468 |
| 2004/0122599 | A1 * | 6/2004 | Opsal et al. | 702/27 |
| 2006/0104544 | A1 * | 5/2006 | Chaudhury et al. | 382/299 |

* cited by examiner

*Primary Examiner*—Anjan Deb
*Assistant Examiner*—Jeff Natalini
(74) *Attorney, Agent, or Firm*—Hill Law Firm

(57) ABSTRACT

A method for measuring and characterizing the nonlinearities of a display device by adaptive bisection using human perception for measurement. This method makes no assumptions about a display device's characteristics and can characterize any type of display device with any arbitrarily complex monotonic display transfer function. Unlike other display measurement solutions, this process is completely software based and has no hardware measurement device requirements that would raise costs and limit portability. As a result, this process can be distributed and applied commercially at a very low cost.

17 Claims, 23 Drawing Sheets

FIG 1 Linear Transfer Function

FIG 2 Typical CRT Transfer Function

FIG 3 Example LCD Transfer Function

CHARACTERIZATION OF THE NONLINEARITIES OF A DISPLAY DEVICE BY ADAPTIVE BISECTION WITH CONTINUOUS USER REFINEMENT

CLAIM OF PRIORITY

This application claims the benefit of U.S. Provisional Patent Application Ser. No. 60/431,490, filed 4 Dec. 2002, entitled "CHARACTERIZATION OF THE NONLINEARITIES OF A DISPLAY DEVICE BY ADAPTIVE BISECTION WITH CONTINUOUS USER REFINEMENT." This provisional application is incorporated herein as if fully set forth.

BACKGROUND OF THE INVENTION

1. Field of the Invention

The present invention is directed to a method for measuring and characterizing the transfer function of a display device using only human perception as the measurement device.

The preferred embodiment is directed to measurement and characterization of a visual display device using only human visual perception as the measurement device. However, the present invention can be applied to the measurement and characterization of other display devices such as tactile or auditory display devices.

The characterization of a display device is typically used in a calibration system to correct the response of the display device to a known standard and/or to produce an application-specific profile that accurately describes the response of the display device.

In applications where visual display devices are utilized, such as the graphic design and publishing industry, a color calibration system is typically employed to produce ICC color profiles for output devices from their characterizations, these profiles later being used in a color management system to control color reproduction across these output devices.

Because this method makes no assumptions about a display device's characteristics, it can be utilized to measure and characterize any type of display device with any arbitrarily complex monotonic display transfer function. These display devices may include, but are not limited to emissive and reflective devices such as cathode ray tubes (CRT), backlit liquid crystal displays (LCD), reflective LCDs, transflective LCDs, gas plasma screens, digital light processing (DLP) devices and LED devices.

Until only recently, the cathode ray tube (CRT) has served as the most commonly used visual display device for desktop personal computers and television monitors. This is due to their combination of high image quality and relatively low price, and the lack of any other commercially viable display technologies that have competed with the CRT on these qualities. Portable computers have used alternate visual display technologies such as liquid crystal display (LCD) devices because of their small size, low weight and low power consumption, but their poor color quality, slow transient response and high price have made LCD technology unsuitable for desktop applications and professional graphic use. However, since their introduction, LCDs have improved dramatically in display quality and dropped in price to very affordable levels, and they are quickly becoming the new standard for desktop applications and entertainment use.

In the average business or home computer installation, the response of a visual display device is usually uncorrected. The brightness and contrast are typically set to some settings that are pleasing to the user, but no attempt is made to make the characteristics of the device match any known standards. While the display characteristics of this uncorrected display are naively acceptable to the average user, the accuracy of the display device is very critical to a graphic professional, and as a result, the display device needs to be calibrated to a known standard or characterized so that color management software can compensate for the display's characteristics. This is necessary so that the graphic artist can use the display to proof images that are targeted for another display device or reproduction medium before they are sent out for use in broadcast television or printed and distributed in literature, for example. If the images cannot be visually proofed before they are distributed, the resulting images may be quite different than what the artist had originally intended.

In the past when printed material and television were the primary distribution mediums for advertising and marketing materials, graphic professionals were the only users that absolutely required the use of a corrected display. However, with the proliferation of personal computers into businesses and households and the introduction of new display technologies like Gas Plasma and Digital Light Processing (DLP), new factors have emerged that necessitate the use of a corrected display by most users. These factors include:

Display technologies with characteristics that are different from that of CRTs display an image that looks very different than that same image viewed on a CRT. The vast majority of images available today were created on and targeted for the standard CRT, so when they are viewed on a variety of devices like LCDs and Gas Plasma displays, the images look very different than what the authors originally intended. Correcting a display's response helps minimize the differences between these different display technologies.

The advent of electronic commerce over the Internet has created a new medium for distribution of advertising and marketing materials and opened the doors to uncontrolled reproduction of potentially color-sensitive images. Traditionally, vendors of products, such as clothing, spend a great deal of time and effort insuring that the images printed in their catalogs are color correct and accurately reflect their product so that the user sees exactly what the delivered product will look like. However with the growth of electronic commerce over the Internet, many users are viewing these same images on web pages that are being viewed on uncorrected monitors. Each and every viewer may see a completely different rendition of the same product image, so it is impossible for a vendor to control what the viewer sees. Correcting a display's response helps maintain the fidelity between the appearance of the original image and the reproduced image.

As new types of display devices are introduced, buyers naturally have higher expectations for the qualities of these new devices, compared to the quality of the old devices that are being displaced. If these new devices perform differently than the displaced devices, these differences may be interpreted as poorer quality and hinder acceptance of the new technology. Correcting a display's response can help to eliminate the apparent differences between old and new technologies.

In order to correct the response of a visual display device, the relationship between the input signal and the perceived output from the face of the device must be known. Once known, this relationship can be used to re-map the input signal values so that the visual display device produces the desired output for a corresponding input signal value. There are numerous existing methods for re-mapping these values, whether it is done in the color look-up table of a video output card either via software or hardware, or in the hardware of a display device, but these methods are not the subject of the present invention.

This relationship between the input signal and the perceived output is called a transfer function. This function may be linear or non-linear, and is not required to follow any prescribed rules. For a CRT device, the relationship can be approximated by a simple power function, as illustrated in FIG. 2.

output=input^gamma

Where:

input=the input value, from 0 to 1 where 0=darkest desired output and 1=lightest desired output output=the display output, from 0 to 1 where 0=darkest output and 1=lightest output gamma=a constant This power function states that the display output is equal to the input value raised to a constant exponential value, usually in the range of 2.3 to 2.6 for a typical uncorrected CRT.

This relationship exists in a CRT because of the physical relationship between the electrostatics of the cathode and the grid of an electron gun. When a phosphor in a CRT is illuminated by an electron gun, the amount of light given off (the output) is proportional to the applied input value (the input) as illustrated above. Most CRTs exhibit this behavior unless there is a design or manufacturing defect in the display, the display is very poorly adjusted, or the manufacturer has chosen to alter the display's behavior in some way.

In LCD devices, however, the relationship of input signal to perceived output is very different because LCDs operate on a different physical principle than do CRTs. Although LCDs vary from device to device, uncorrected LCDs typically have transfer functions that are shaped as illustrated in FIG. 3.

From the graphs of the transfer functions, one can see that CRTs and LCDs have very different response characteristics. An image displayed on an uncorrected CRT and an image displayed on an uncorrected LCD may look very different when viewed next to one another. Take the images in FIGS. 4, 5 and 6 as examples. The first image was created on a corrected CRT display with a gamma response of 1.8. Viewed on a CRT with a gamma response of 1.8, the viewer would see 11 distinguishable steps from black to white as illustrated in FIG. 4.

Viewed on a CRT with a gamma response of 2.5, the viewer would see an image that is darker overall than it should be. The two darkest patches appear to blend together, as illustrated in FIG. 5.

Viewed on an uncorrected LCD, the viewer would see an image that is too dark in the darkest region and too light in the lightest region. The two darkest patches appear to blend together and the two lightest patches appear to blend together, as illustrated in FIG. 6.

And just as LCDs differ from CRTs, other visual display technologies with different characteristics may produce equally different output images given the same input image.

Once the relationship between the input signal and the perceived output from the face of the device is known, the response of a display can be corrected and the detrimental problems mentioned previously can be reduced or eliminated.

The ability to correct the response of a display device allows any image created for that response to be properly displayed. A user would have the ability to adjust his or her display to suit the material being viewed, or in an ideal case, to have the computer do the adjustment automatically. For example, if images were being generated for print, the user could adjust the display to the response of the print medium and judge what the images would look like when printed. Similarly, if images were being generated for viewing on a web page, a user might adjust his display to the response of an uncorrected CRT to proof what the images would look like on the vast majority of the existing CRT displays connected to the Internet and viewing web pages.

2. Description of the Prior Art

There exist methods and devices for measuring the transfer function of a display device and subsequently correcting the response of the device through calibration.

Some of these methods involve attaching a hardware device to the display and measuring the actual output for every given input value. Methods such as this can be reasonably accurate, but they neglect certain factors like contributions from ambient lighting that will affect the accuracy of the measurements. In addition, a hardware device dramatically increases the cost of a solution, reducing its potential market.

Other methods are software-based, and rely on the user's ability to compare the brightness of two or more different patches displayed on the display device. Unfortunately, current methods are only applicable to CRT devices because they make the assumption that the response of the device follows the ideal gamma response of a CRT and that a single measurement is all that is necessary to determine the transfer function of the device. While this may produce an acceptable result some of the time, ambient lighting, design flaws and manufacturing defects can significantly alter the behavior of a display, rendering the results incorrect. When these methods are applied to a display device with different characteristics than a CRT, such as a LCD, the result is grossly inaccurate. To accurately determine the transfer function of a device, a plurality of measurements must be made across the dynamic range of the device in order to determine the relationship between input and output. No assumptions should be made about the shape of a particular device's transfer function.

SUMMARY OF THE INVENTION

It is an object of the present invention to provide a high-resolution measurement and characterization method that works on any display device with any arbitrarily shaped monotonic transfer function.

It is an object of the present invention to utilize human perception for measurement. The human visual system is very good at making relative brightness comparisons and it can be argued that it is as accurate as the user might ever need because it is exactly what the user will be using to perceive the output from a display device. Further, it can be argued that any nonlinearity in the visual system of the user and any effects of environmental lighting would be compensated for in the measurements made by the person.

It is an object of the present invention to allow characterization of the nonlinearities of a display device by adaptive bisection with continuous user refinement.

It is an object of the present invention to teach usage of visual test patterns that allow user measurement through adaptive bisection.

It is an object of the present invention to operate with any type of display device with any arbitrarily shaped monotonic transfer function.

It is an object of the present invention to provide high-resolution characterization that is of sufficient resolution to define a transfer function that is representative of a display device's true response.

It is an object of the present invention to support resolution-independent values that are not restricted to the discrete integer values supported by most current digital video circuitry (due to quantization).

It is another object of the present invention to enable a software-only measurement and characterization solution. A software-only solution allows the solution cost to be kept to a minimum because hardware measurement components can dramatically increase the cost of a solution, reduce its portability and decrease its usability by novice users. Although, the present invention could be automated with an un-calibrated light meter capable of only relative measurements.

It is not an object of the present invention to teach a complete software or hardware solution because many steps are required in a complete solution and many of these steps exist in current calibration and color management solutions.

It is not an object of the present invention to teach a specific physical orientation of visual test patterns by which test pattern data is to be displayed to the user. Many methods exist for displaying test patterns and it is not our intention to reiterate these methods here.

The above as well as additional objectives, features, and advantages will become apparent in the following description.

BRIEF DESCRIPTION OF THE DRAWINGS

The novel features believed characteristic of the invention are set forth in the appended claims. The invention itself however, as well as a preferred mode of use, further objectives and advantages thereof, will best be understood by reference to the following detailed description of the preferred embodiment when read in conjunction with the accompanying drawings, wherein:

DETAILED DESCRIPTION OF THE INVENTION

Figure 1:
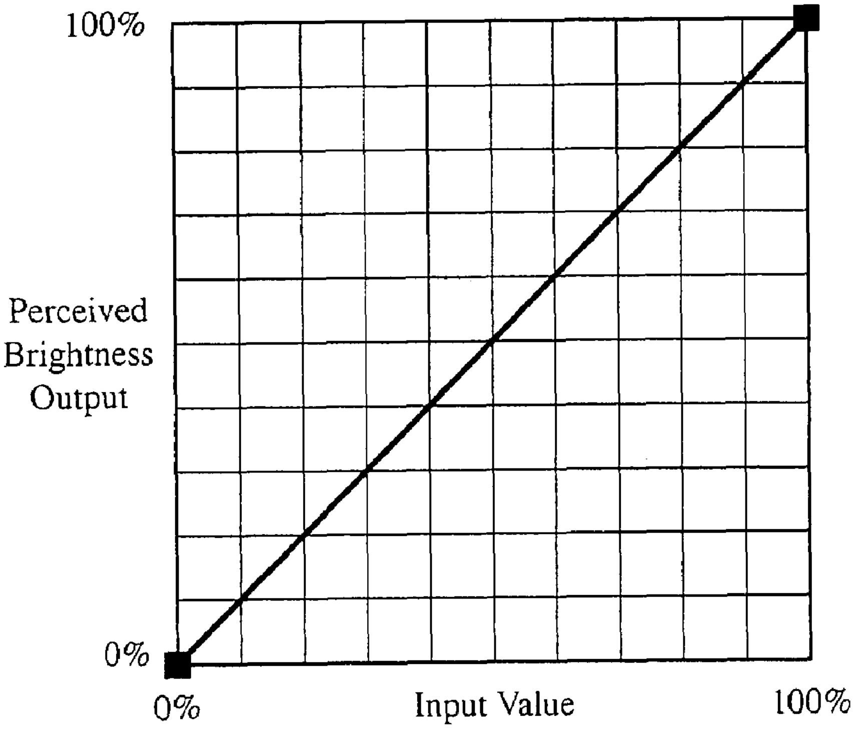
FIG. 1—Example of a linear transfer function
Figure 2:
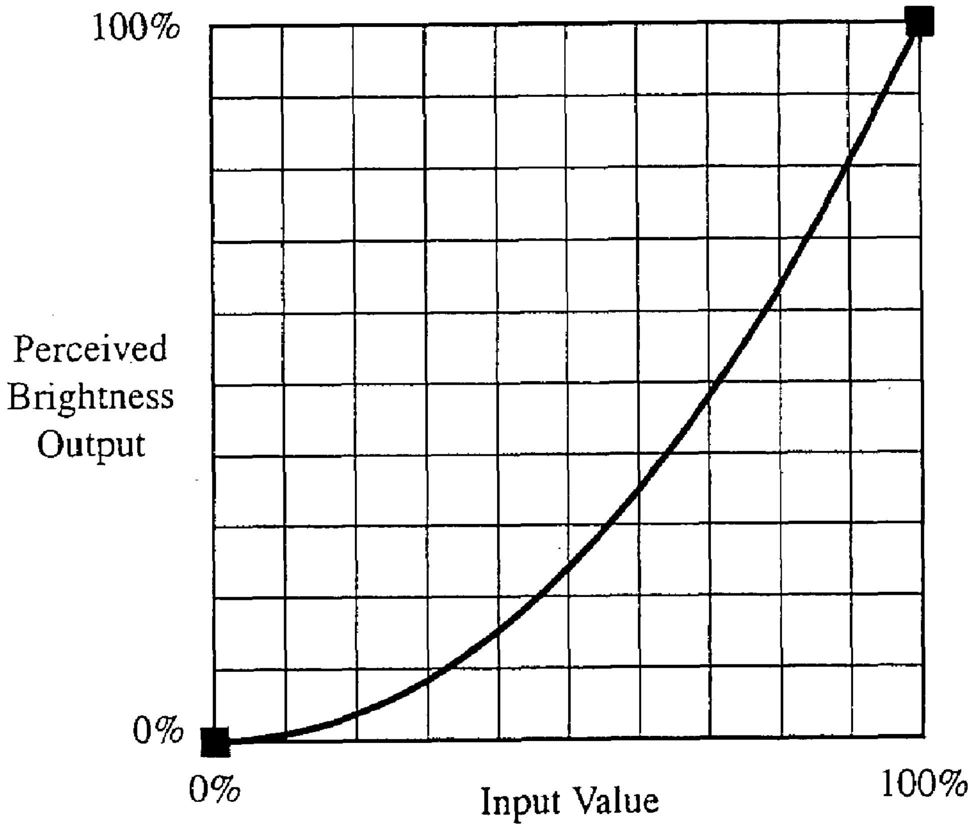
FIG. 2—Example of a transfer function for a typical, uncorrected CRT device
Figure 3:
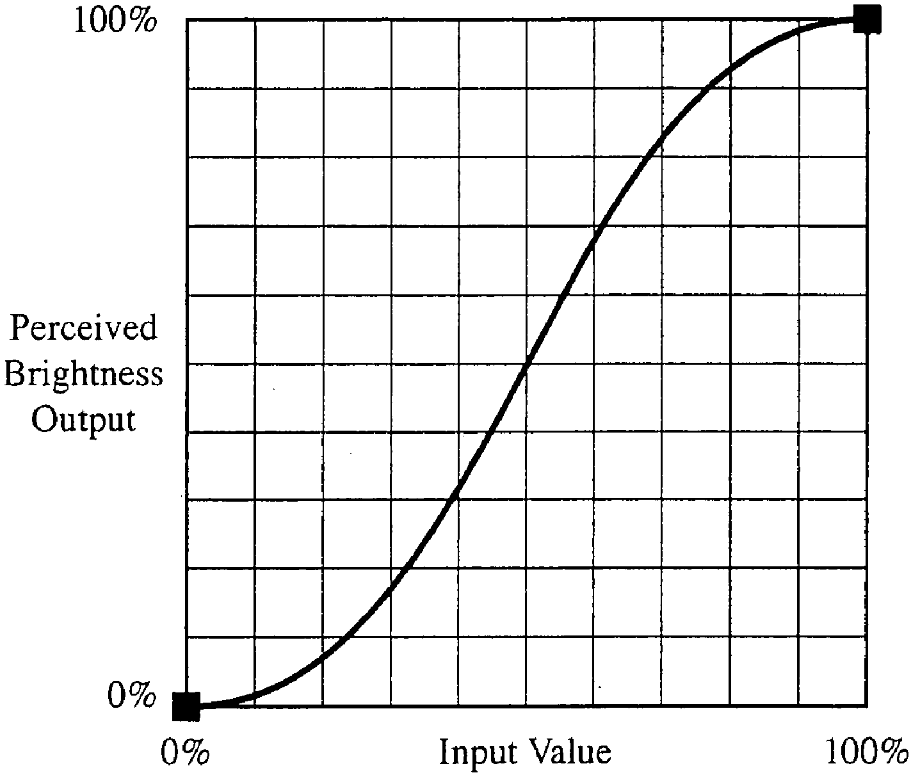
FIG. 3—Example of a transfer function for a typical, uncorrected LCD device
Figure 4:
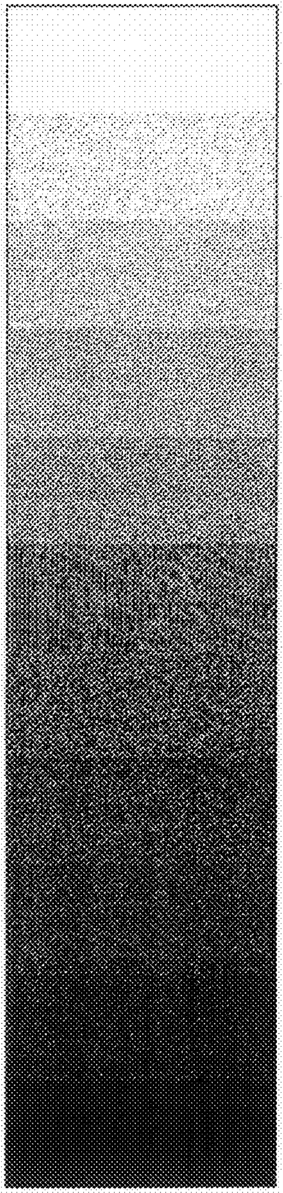
FIG. 4—Gray Ramp as viewed on a CRT with a Gamma of 1.8
Figure 5:
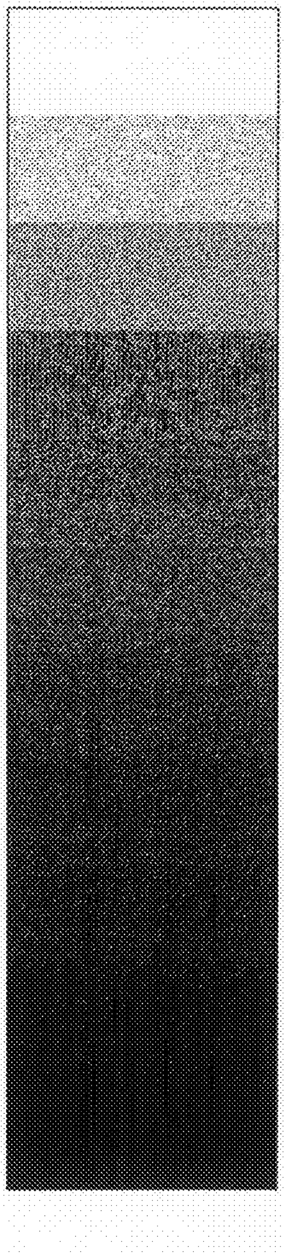
FIG. 5—Gray Ramp as Viewed on a CRT with a Gamma of 2.5
Figure 6:
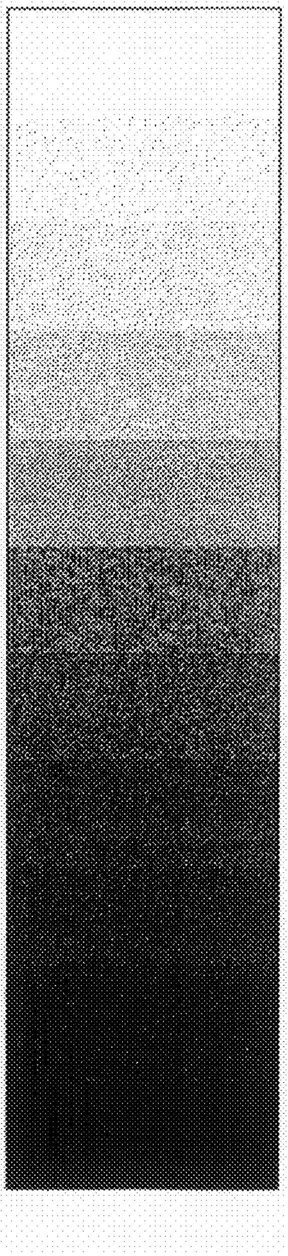
FIG. 6—Gray Ramp as Viewed on an Uncorrected LCD

We start by defining a glossary of basic terminology that will be used to describe the present invention.

Display Input Value—the value driving the display device

Discreet Display Input Value—a quantized digital value that drives the display device Minimum Display Input Value—the lowest driving value that can be sent to the display device Maximum Display Input Value—the highest driving value that can be sent to the display device Estimated Display Input Value—the display input value found by passing the test input value through the approximating spline transfer function Perceived Brightness Output—the intensity of light that an observer can perceive being emitted or reflected from a display device Lowest Perceived Brightness Output—the minimum brightness that can be perceived on the display device Highest Perceived Brightness Output—the maximum brightness that can be perceived on the display Darkest Display Input Value—the highest display input value where the perceived brightness output matches the perceived brightness output corresponding to the minimum display input value Lightest Display Input Value—the lowest display input value where the perceived brightness output matches the perceived brightness output corresponding to the maximum display input value Display Transfer Function—represents the relationship between display input values and the perceived brightness outputs Approximating Spline—built up step at a time to represent an inverse transfer function for the display device. It represents the inverse input/output transfer function necessary to linearize the input/output transfer function of the display device. This represents the relationship between a test input value and its corresponding display input value.

Test Input Value—input to the approximating inverse spline used to test at different points Minimum Test Input Value—maps through the approximating spline to the darkest display input value Maximum Test Input Value—maps through the approximating spline to the lightest display input value Control Points—define the shape of the approximating inverse curve, and represent the points at which a visual comparison has been made Test Points—represent locations along the approximating inverse spline where visual comparisons and adjustments could be made Test Point Candidate List—includes a possibly redundant or overly-dense set of input values that can be presented as a visual test pattern Test Point's Parents—the one or more control points that were used to generate the test point Visual Test Pattern—a pattern presented on the display that allows a user to make visual comparisons between at least two regions for perceived brightness contrast or similarity Compensating Transfer Function—the transfer function which signals must pass through before passing through the display transfer function in order to achieve the targeted display brightness outputs Because the method of the present invention takes advantage of our visual perception as the measuring device, it is necessary to produce and display certain visual test patterns in order for a user to perform measurements.

A visual test pattern consists of at least two spatially distinct regions 102, 104 that are displayed on a display device. The regions may be of any arbitrary shape, but ideally, they are located adjacent to one another, touching along at least one edge 110, 204. There are no requirements, however, on their relative placements. One region may completely contain or surround the other region, or the regions may simply be placed adjacent to one another.

A region 102 may be composed of homogeneous pixels of a given color and intensity value, or it may be further divided 104 into at least two sub-regions, each sub-region 106 & 108 being composed of pixels of homogeneous color and intensity value.

Figure 7:
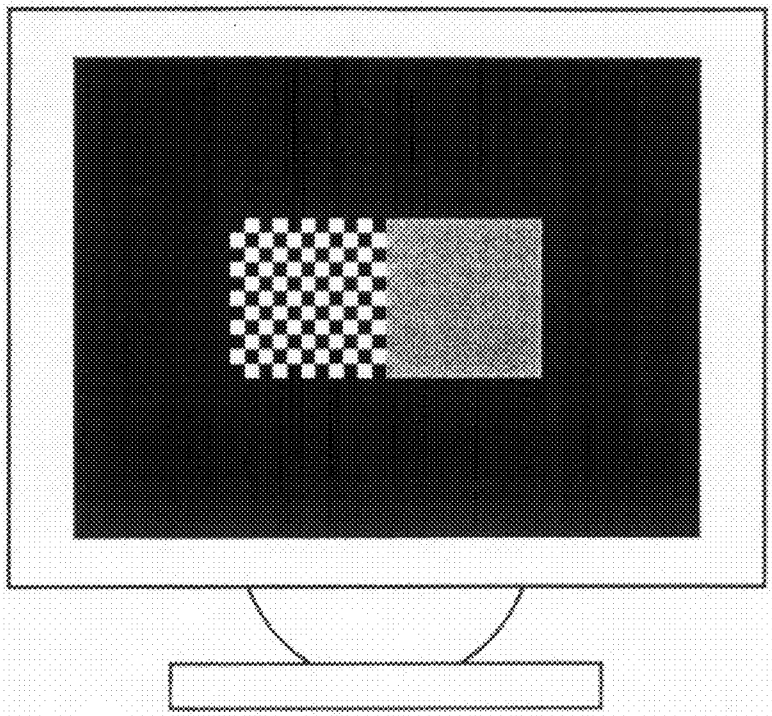
FIG. 7—Example of a test pattern with heterogeneous and homogeneous regions
Figure 12:
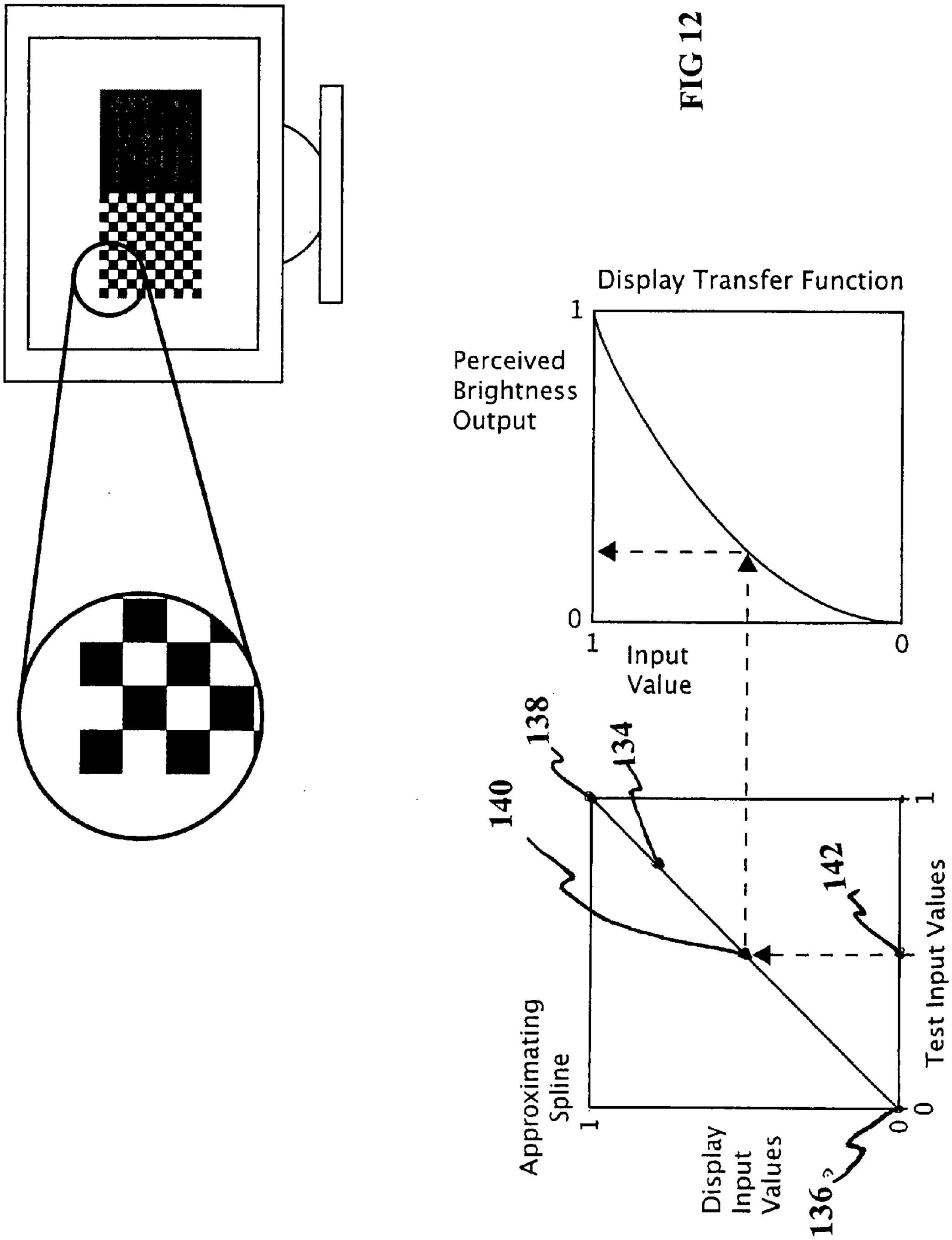
Figure 13:
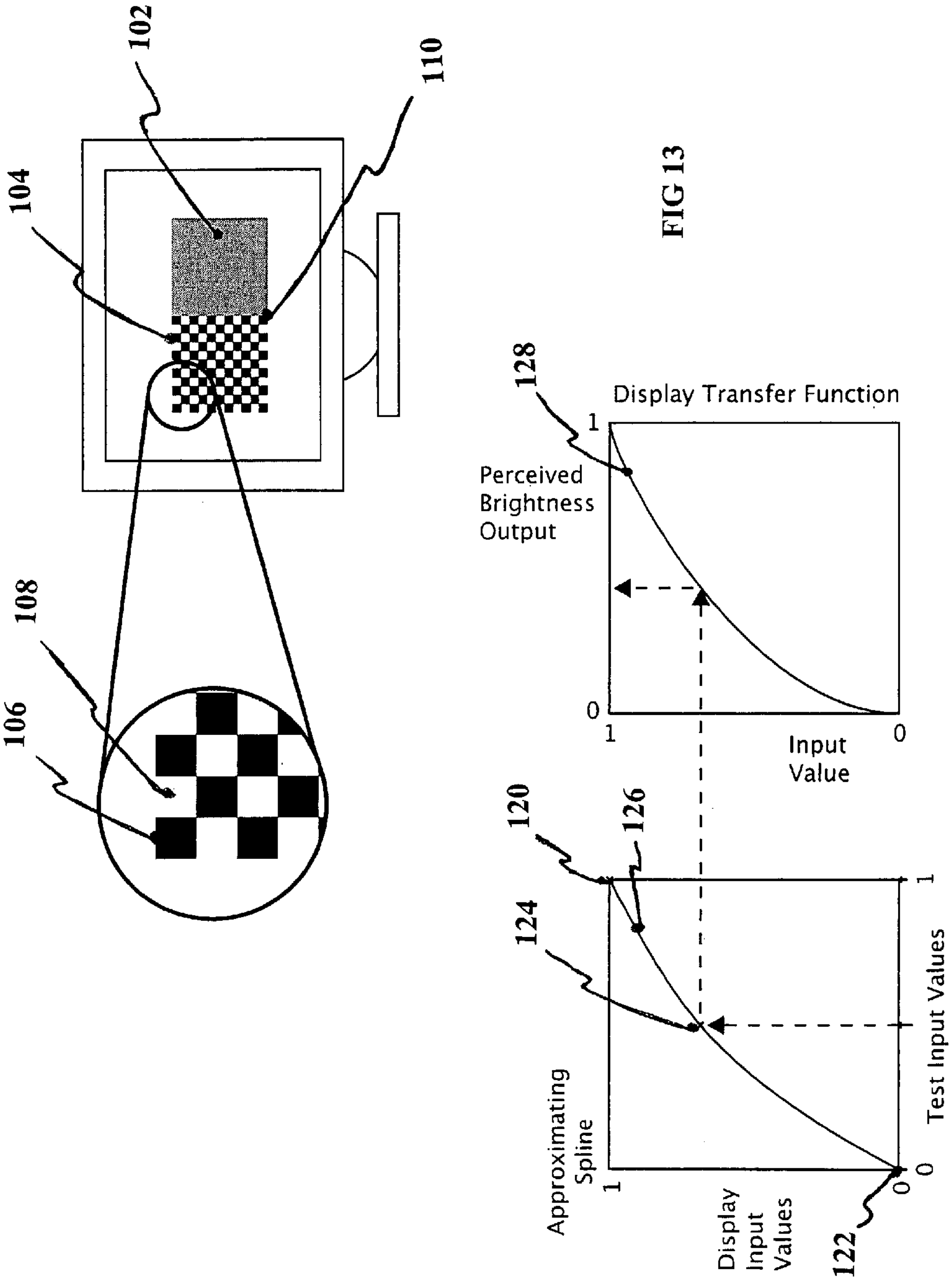

When a region 104 is further divided into sub-regions, the sub-regions should ideally be of a size equal to or larger than a single pixel on the display device to prevent detrimental effects that occur when displaying an image sampled at a higher frequency than the display is capable of reproducing. In the preferred embodiment, one-half of the sub-regions are composed of pixels of one color and intensity and the remaining sub-regions are composed of pixels of a second color and intensity. FIGS. 7, 12 and 13 illustrate a region divided into sub-regions in this manner. When the sub-regions are of a sufficiently small size and they are spatially interspersed (known as halftone or dither), the eye will integrate the sub-regions and perceive the sub-regions as a single region of a homogeneous color and intensity.

The perception of the sub-regions as a homogeneous color and intensity is represented by:

$$\text{intensity\_total\_region}=(\text{intensity\_1}*(\text{area\_of\_sub-region\_1}/\text{total\_region\_area}))+(\text{intensity\_2}*(\text{area\_of\_sub-region\_2}/\text{total\_region\_area}))+(\text{intensity\_}n*(\text{area\_of\_sub-region\_}n/\text{total\_region\_area}))+k$$

Where k is a constant that represents an additive or subtractive lighting effect caused on the face of the display device by ambient lighting or display characteristics.

Figure 8:
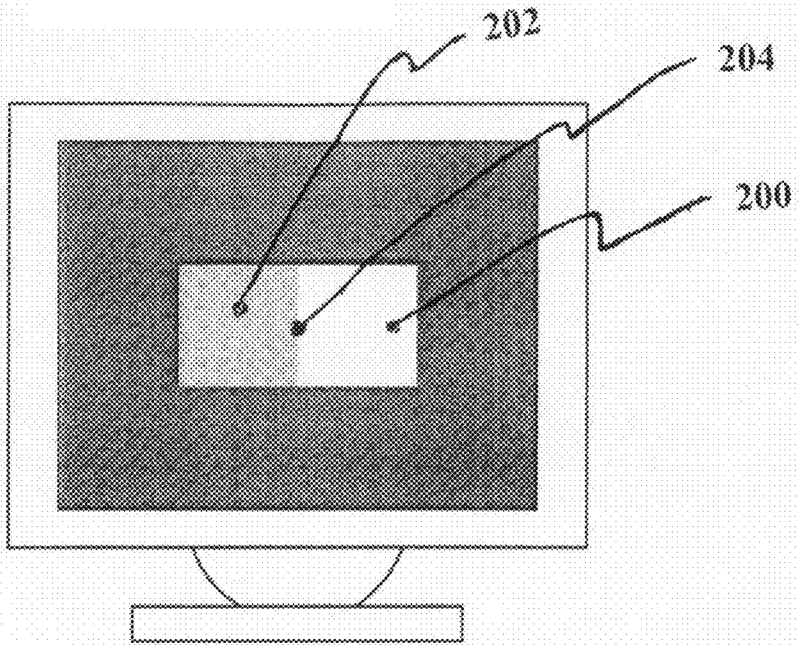
FIG. 8—Example of a test pattern with two homogeneous regions being used to measure lightest display input value FIG. 9—Example of a test pattern with two homogeneous regions being used to measure darkest display input value FIG. 10—Example of a transfer function for a CRT device with non-uniquely perceivable display input values FIG. 11—Transfer function for a CRT device with normalized, uniquely perceivable brightness outputs FIG. 12—Conversion of test input values to perceivable brightness output in regions of a visual test pattern FIG. 13—Conversion of test input values to perceivable brightness output in regions of a visual test pattern FIG. 14—Smoothing of approximating spline FIG. 15 A-L—Diagrams illustrating the progression and continuous refinement of an approximating spline with available test points Exhibit A (34 pages)—User manual and screenshots for the Apple Macintosh application Exhibit B (345 pages)—Project listing, object class hierarchy and source code to the Apple Macintosh implementation of a visual display calibration application that utilizes the present invention
Figure 9:
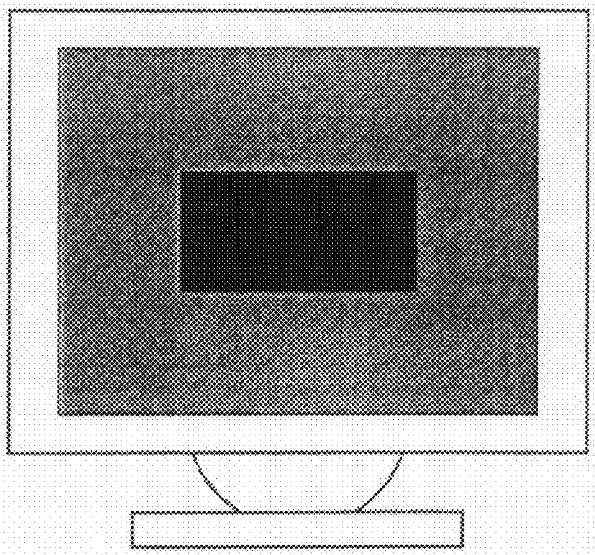
Figure 10:
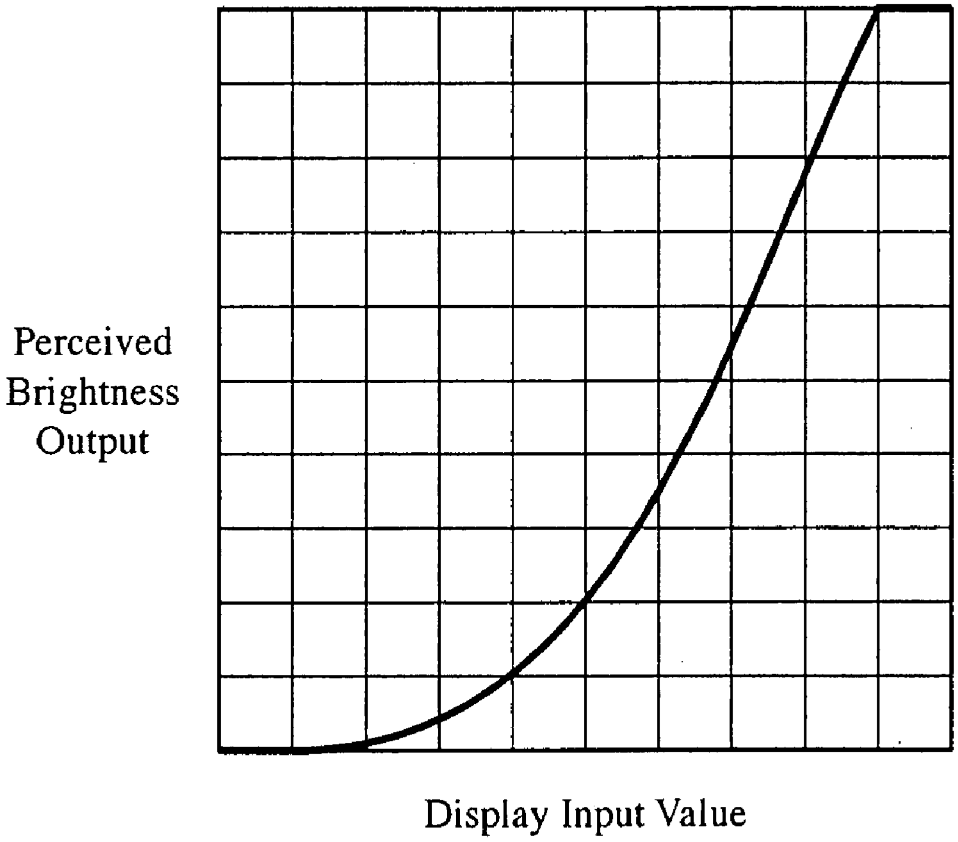

A region 102, 200, 202 composed of pixels of a homogeneous color and intensity value is used in visual test patterns where the perceived brightness output of the region must correspond to a discreet input value. FIG. 8 and FIG. 9 illustrate adjacent regions of homogeneous color and intensity that must be compared to determine the point at which they diverge from being of similar brightness to just being of differing brightness, as is used to determine the Darkest Input Value (FIG. 9) or the Lightest Input Value (FIG. 8).

A region 104 composed of sub-regions of disparate color and intensity values is useful in visual test patterns where the perceived brightness output of the region must be the integrated brightness of the perceived brightness outputs corresponding to at least two different input values. This is used in test patterns (FIG. 9) when measuring test points other than the Darkest Input Value (FIG. 9) and the Lightest Input Value (FIG. 8).

A region composed of sub-regions of nearly identical color and intensity values is useful in visual test patterns where the perceived brightness output of the region must correspond to an input value for which there is not a discreet input value. This occurs in such a case where the video card does not have a bit depth sufficient enough to provide the desired resolution of discreet input values. By composing said region of sub-regions of nearly identical color and intensity values, intermediate brightness values may be achieved by mixing two or more colors and brightness values to achieve the desired value, yielding a higher resolution of brightness values than the video card is capable of. Again, the eye will integrate and perceive the sub-regions as a single region of a homogeneous color and intensity.

Because the human eye is extremely sensitive to contrast, visual perception can very accurately compare the brightness of adjacent regions and easily distinguish when the regions are of differing perceived brightness and when they are of similar perceived brightness. Depending upon the goal of the comparison, a visual comparison is performed by displaying said first and second regions, then adjusting perceived brightness of one of said regions until the perceived brightness of both said regions are equal, or until the perceived brightness of both said regions are slightly different, depending upon the goal of the comparison.

Adjusting the perceived brightness of a region may be done several ways. The perceived brightness output of the second region can be varied by altering the corresponding display input value until its perceived brightness matches that of the first region. Conversely, the perceived brightness output of one or more sub-regions that comprise the first region may be adjusted up or down until the perceived brightness output of the first region matches that of the second region. Either way, at this point, a visual comparison measurement has been made.

A method for adjusting the perceived brightness output of a region may involve manipulating a user interface control that varies the perceived brightness in relation to the position of the control. An alternate method for adjusting the perceived brightness may involve presenting multiple second regions to the user simultaneously, each second region differing slightly in perceived brightness, where the user simply specifies which second region matches the first region most accurately. However, it is not the intention of this invention to teach a new method of brightness adjustment because existing methods such as these suggested here are already known.

These visual comparison measurements are used to determine the shape of the inverse of the display transfer function by applying them in an ordered and iterative process. Initially, the display transfer function is an unknown relationship between the display input values and the perceived brightness outputs. After identifying the subset of display input values which correspond to unique perceivable brightness outputs as described below, an approximating spline is successively built up as the characterizing transfer function between test input values and display input values.

Typically, hardware that is used to drive displays uses digital to analog converters with a finite number of analog steps, typically 8 bit converters with 256 output levels or 10 bit converters with 1024 output levels. The calculations described below are typically done using floating-point math that is quantized to discrete display input values. Additionally, the measurements and calculations are channel-independent.

In the beginning, all that is known is that the minimum display input value will produce the lowest perceivable brightness output, and the maximum display input value will produce the highest perceivable brightness output.

The first step is to determine the darkest display input value, which is the highest display input value where the perceived brightness output matches the perceived brightness output that corresponds to the minimum display input value.

Due to reflected ambient light and improper adjustment of the black level control on the display device, the lowest perceivable brightness output usually remains perceivably constant between the minimum display input value and some higher display input value referred to as the darkest display input value.

The darkest display input value is determined by measuring using a visual comparison text pattern with first said region composed of homogenous pixels corresponding to the minimum display input value and said second region composed of homogeneous pixels also corresponding to the minimum display input value. The perceived brightness output of the second region is then adjusted upwards by increasing the corresponding display input value until the perceived brightness output of the second region is just distinguishable from that of the first region. The perceived brightness output of the second region is then adjusted downwards by decreasing the corresponding display input value. The first display input value at which the second region is no longer distinguishable from the first region is the darkest display input value.

Optionally, the second step is to determine the lightest display input value, which is the lowest display input value where the perceived brightness output matches the perceived brightness output that corresponds to the maximum display input value.

Due to the performance characteristics of the display, the highest perceivable brightness output may remain perceivably constant between the maximum display input value and some lower display input value referred to as the lightest display input value.

The lightest display input value is determined by measuring using a visual comparison text pattern with first said region composed of homogenous pixels corresponding to the maximum display input value and said second region composed of homogeneous pixels also corresponding to the maximum display input value. The perceived brightness output of the second region is then adjusted downwards by decreasing the corresponding display input value until the perceived brightness output of the second region is just distinguishable from that of the first region. The perceived brightness output of the second region is then adjusted upwards by increasing the corresponding display input value. The first display input value at which the second region is no longer distinguishable from the first region is the lightest display input value.

Figure 11:
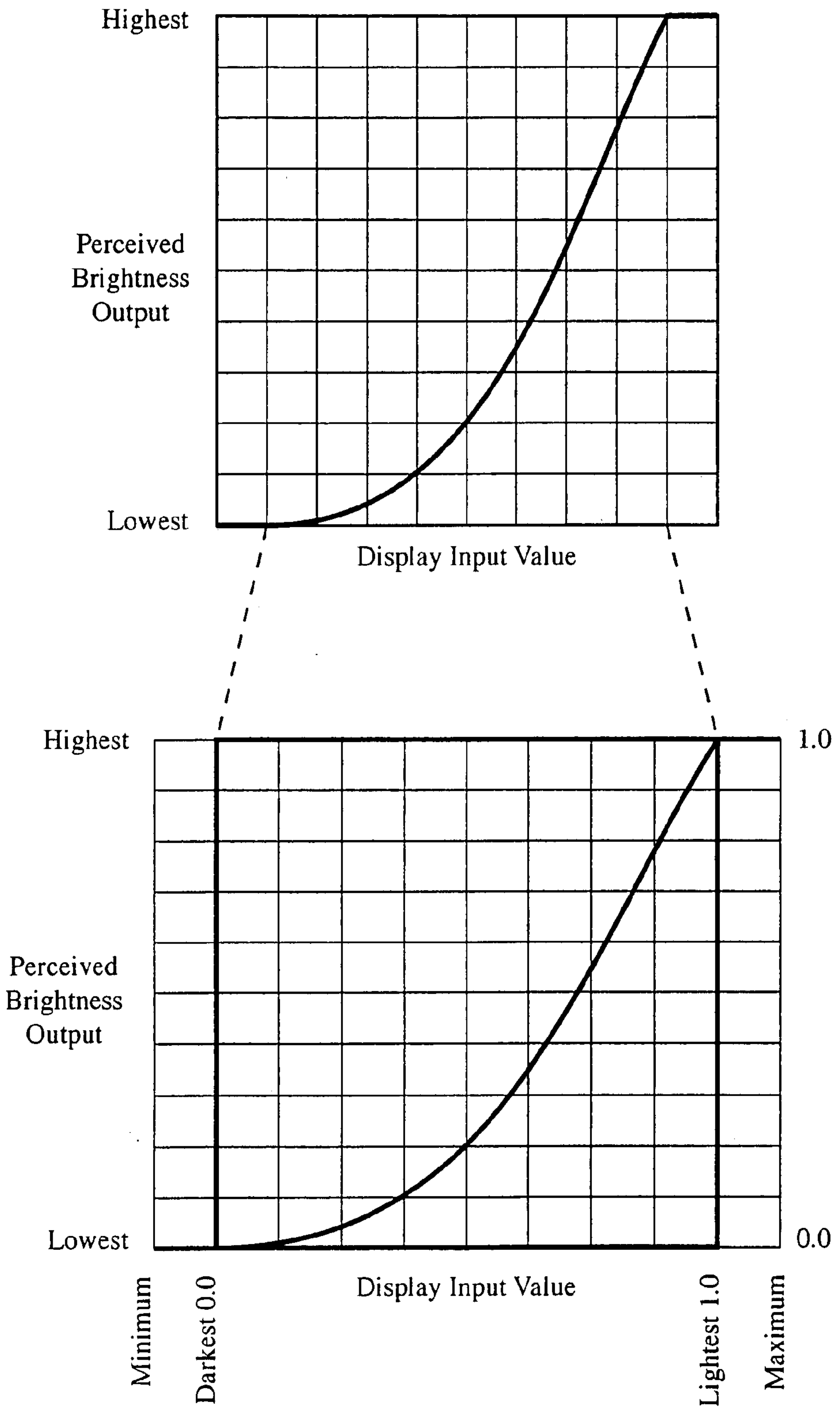

At this point, the full range of the achievable perceived brightness outputs is between the darkest display input value and lightest display input value (FIG. 11). These ranges are normalized into a scale of 0.0 to 1.0 display input value and 0.0 to 1.0 perceived brightness output.

Test input values are passed through a transfer function represented by the approximating spline to produce display input values. The scale for test input values is also normalized to 0.0 to 1.0 (FIGS. 12 and 13).

The approximating spline is defined by control points 120, 122, 124, which represent known relationships from a test input value through the approximating spline 126 to a display input value and then through the display transfer function 128 to a perceived brightness output.

Initially two control points 136, 138 are created, at minimum and maximum values, and the approximating spline 134 is a line, representing a linear transfer function relationship between test input values and display input values.

Figure 14:
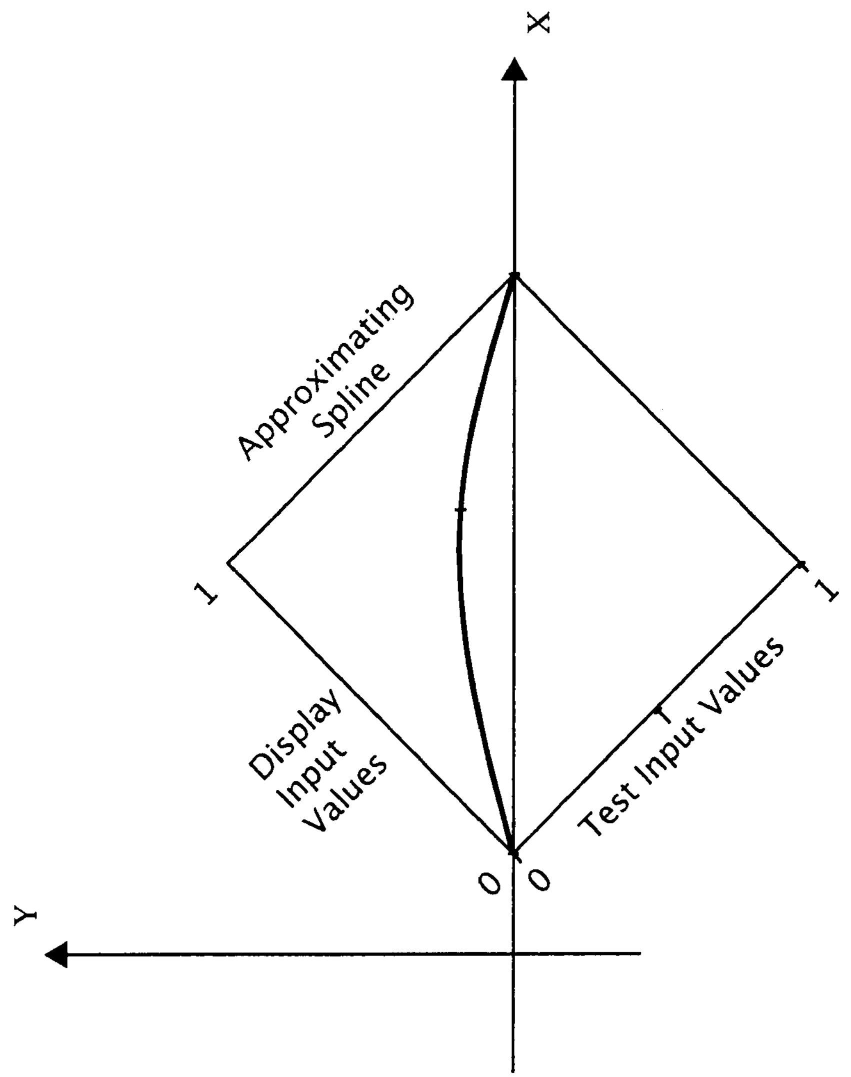
Figure 15A:
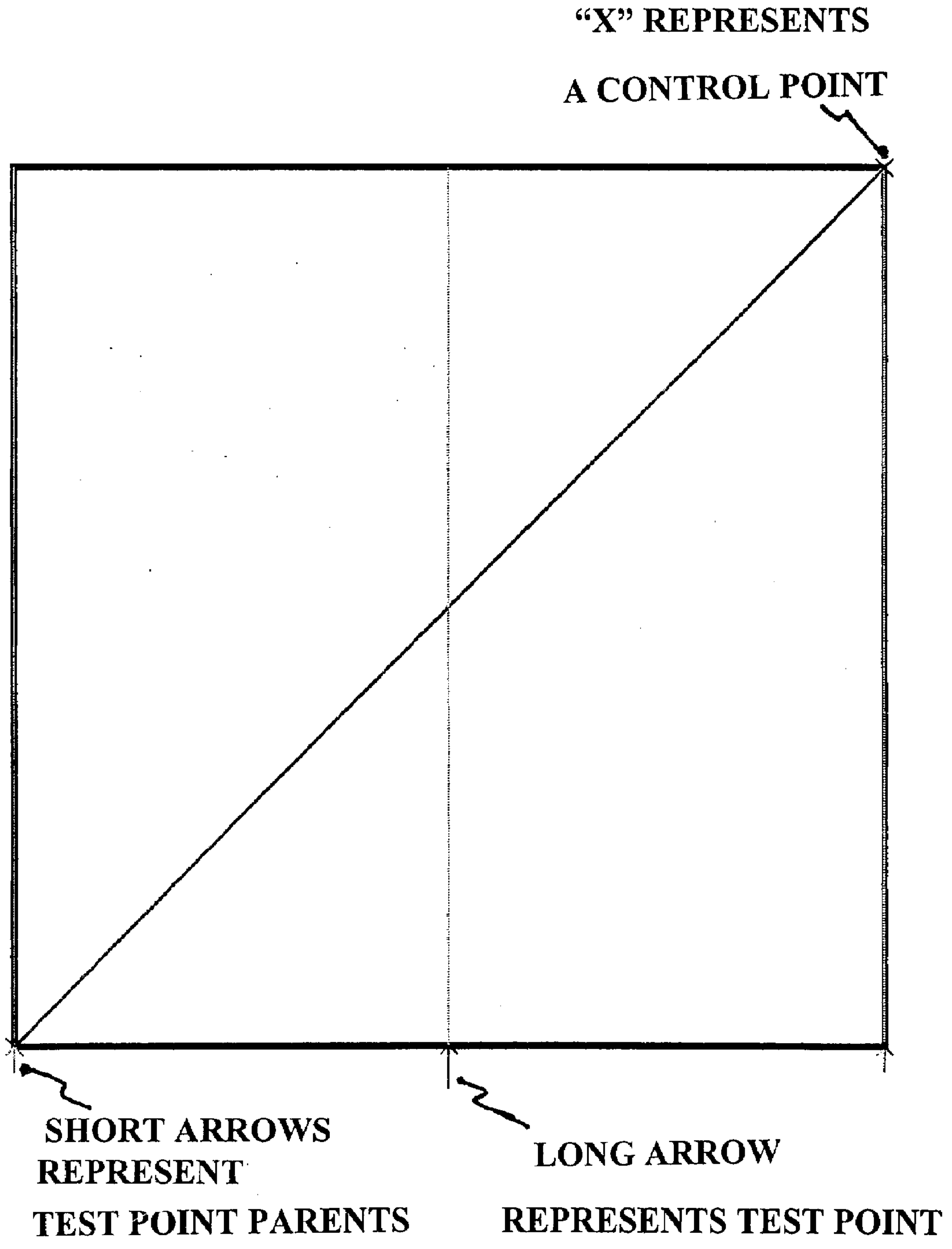
Figure 15B:
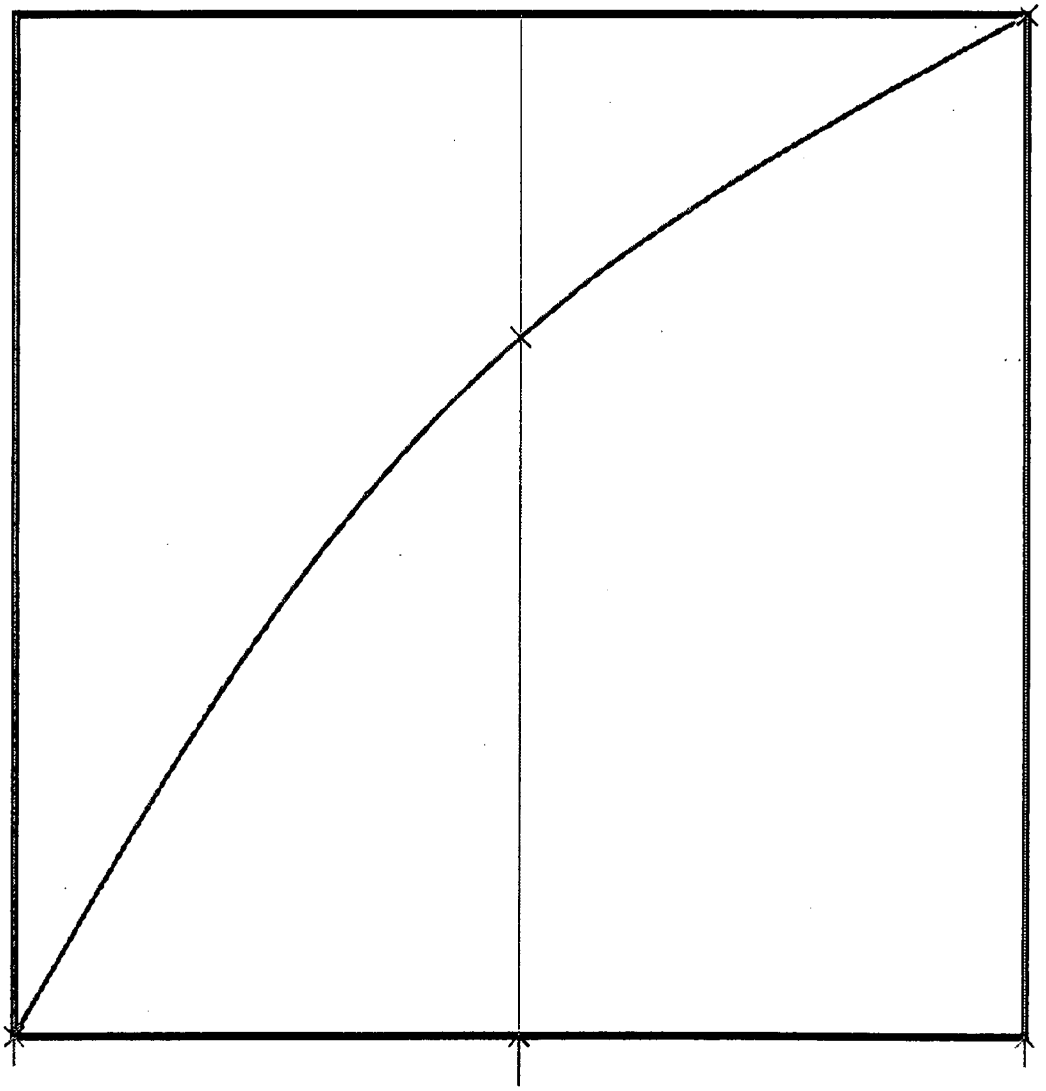
Figure 15C:
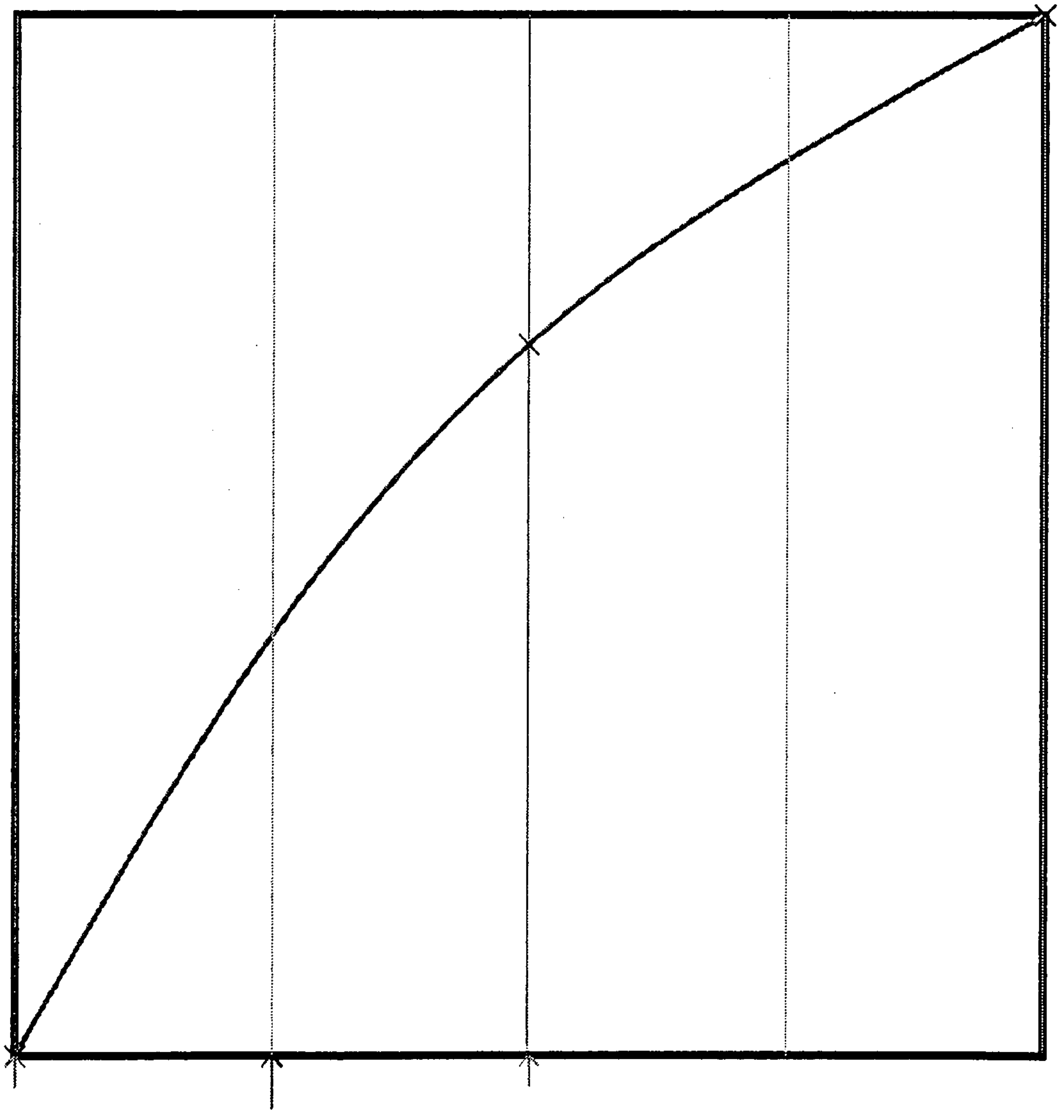
Figure 15D:
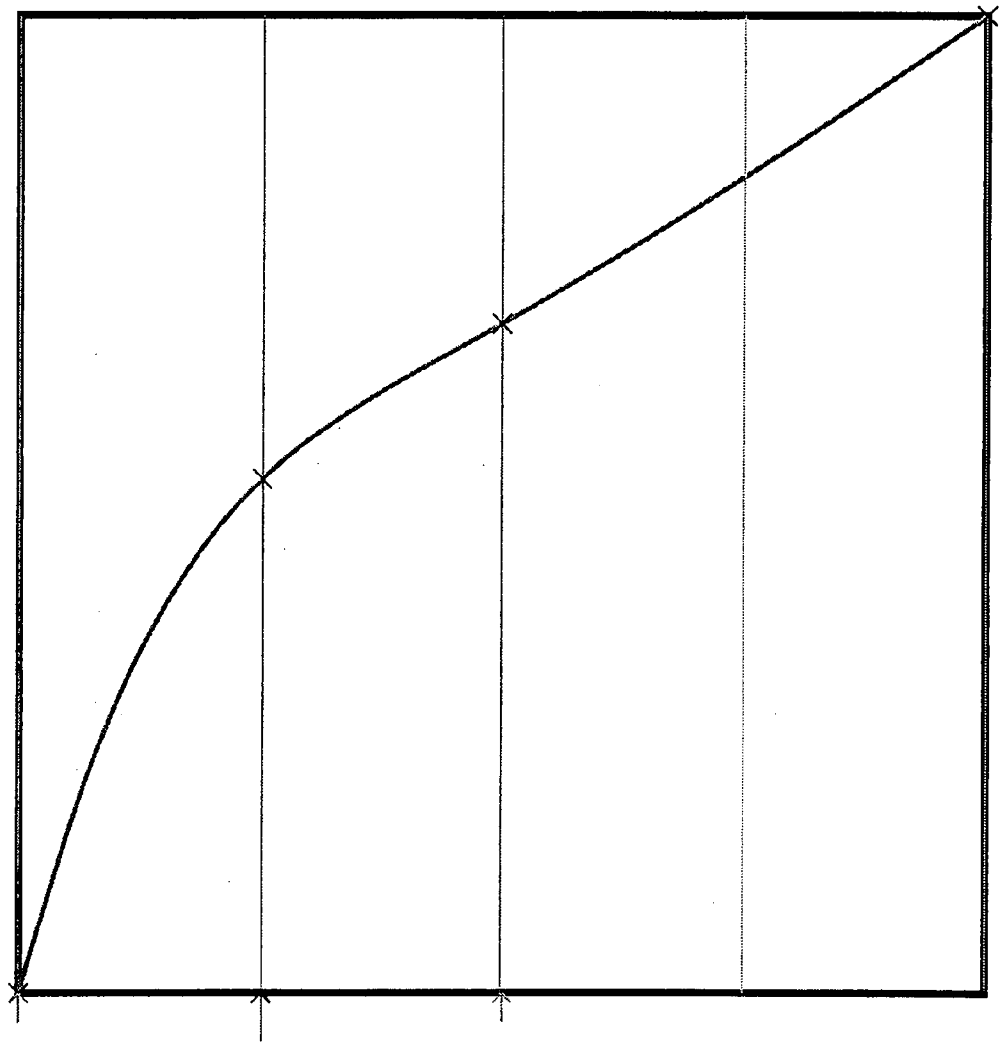
Figure 15E:
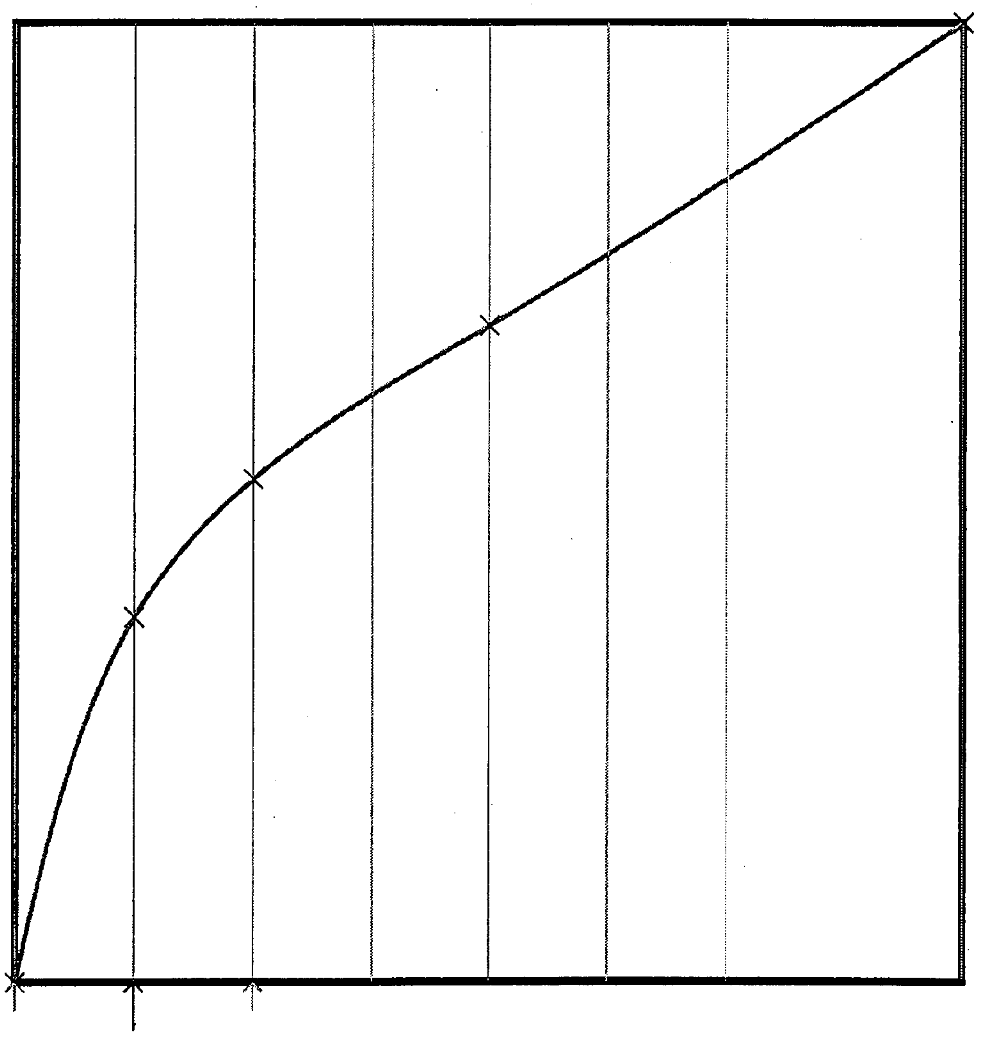
Figure 15F:
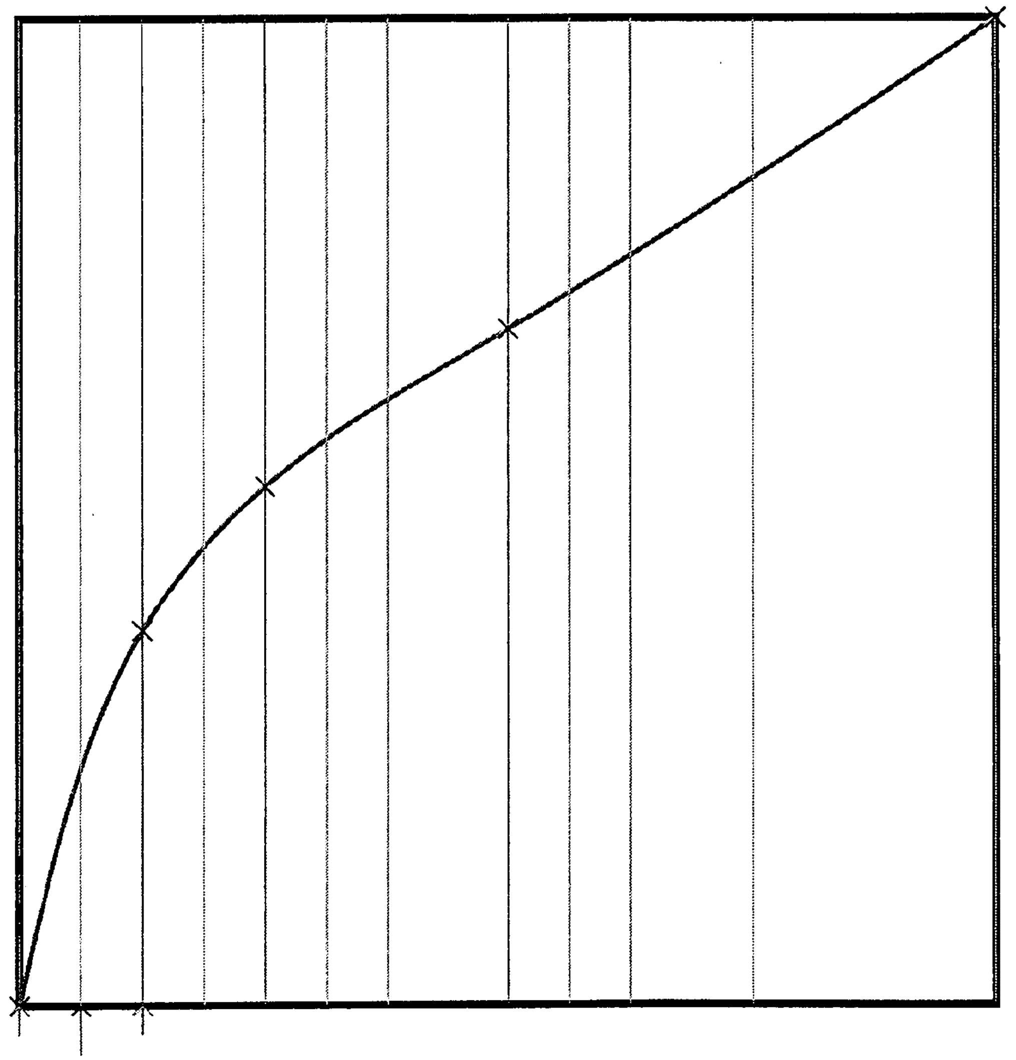
Figure 15G:
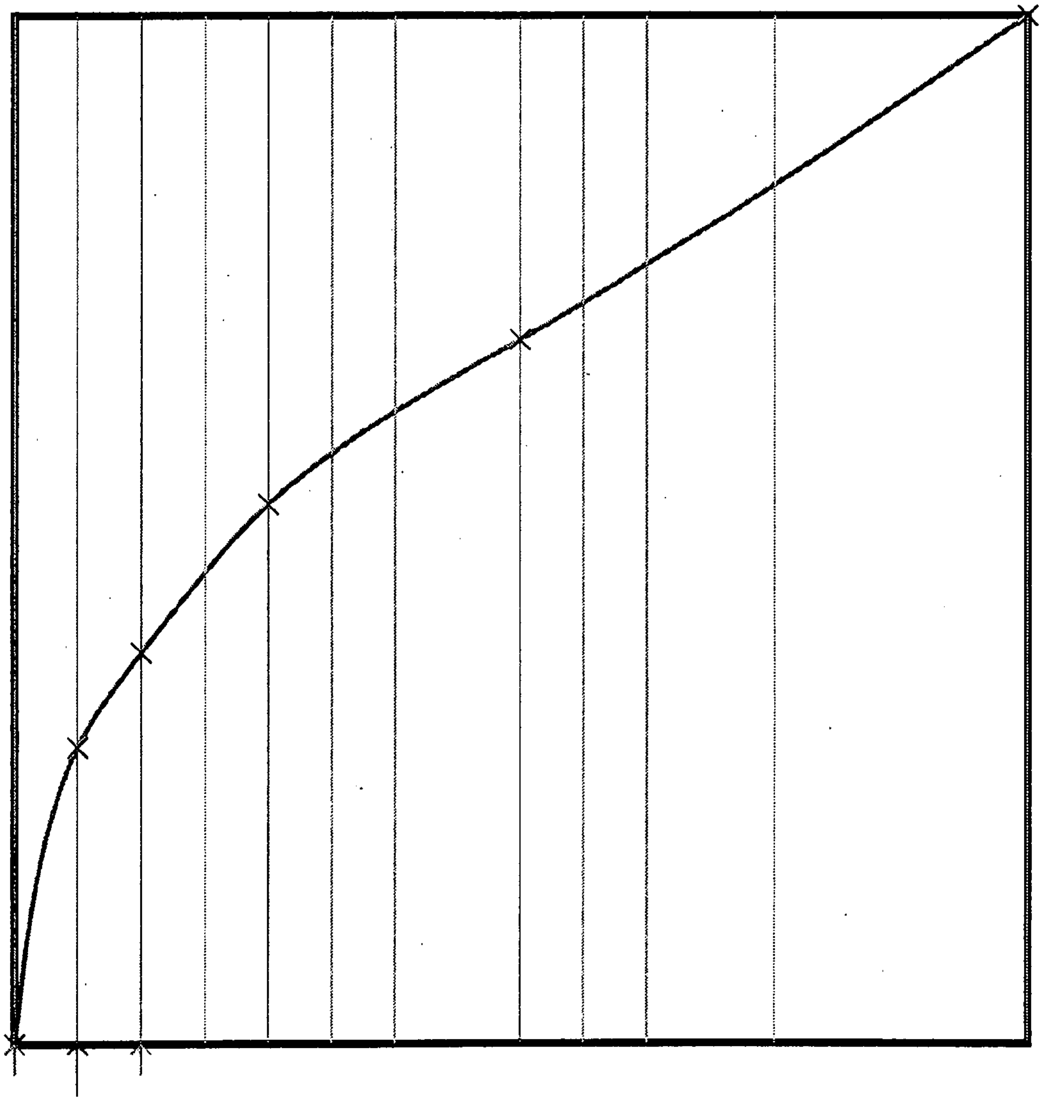
Figure 15H:
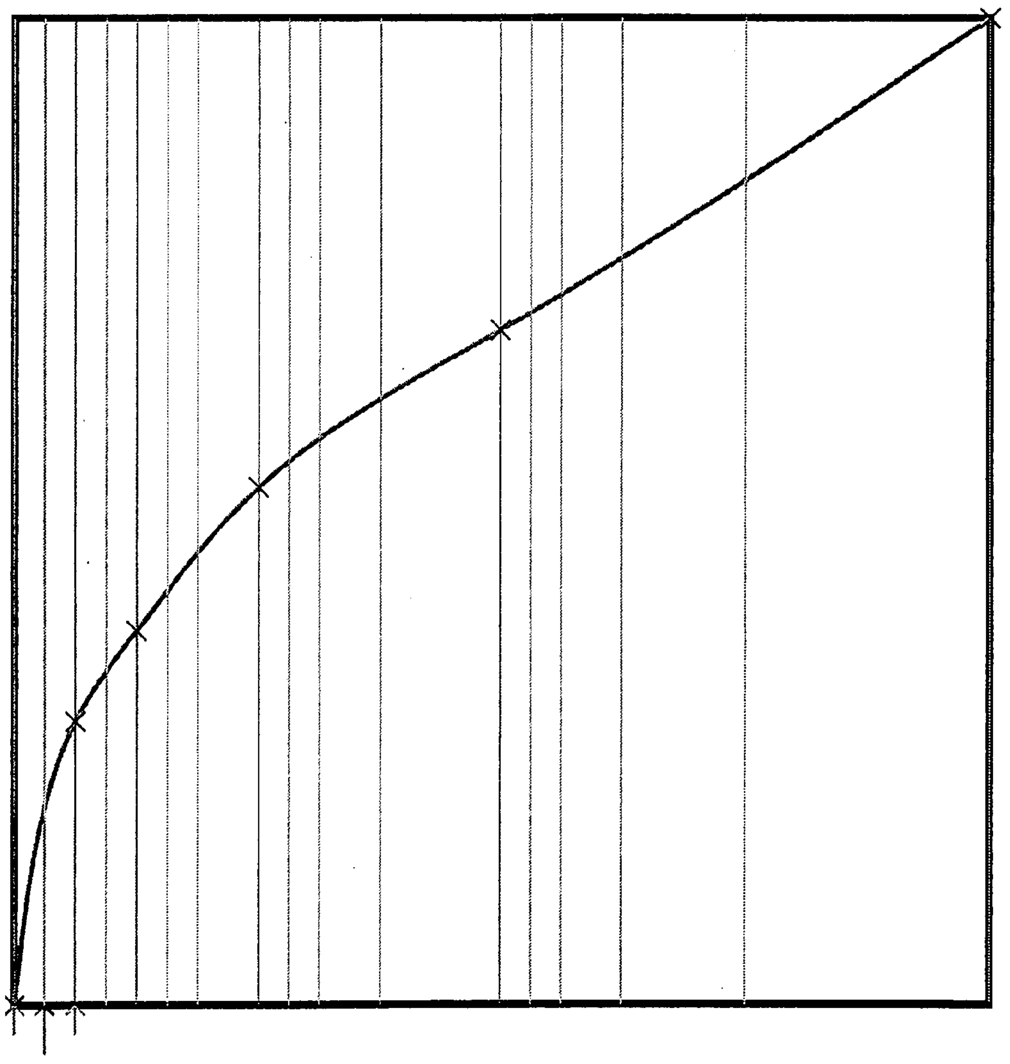
Figure 15I:
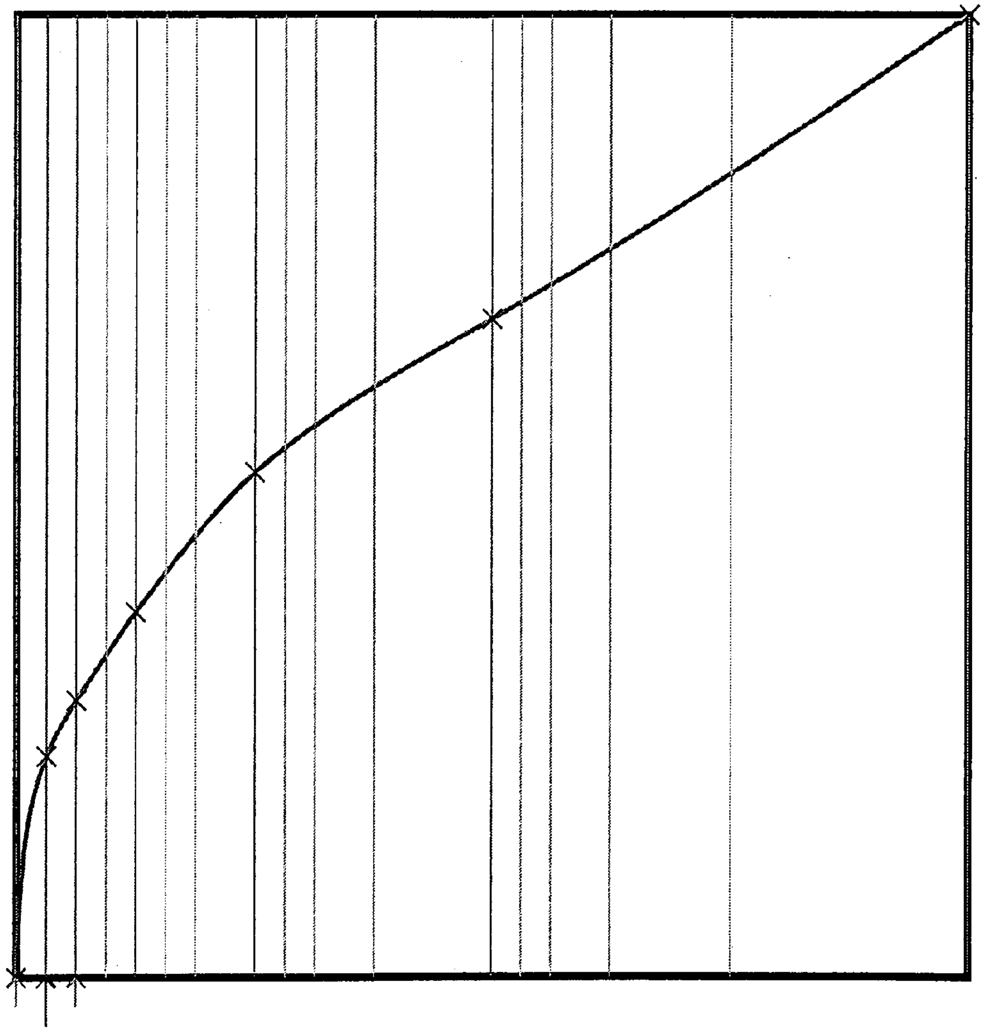
Figure 15J:
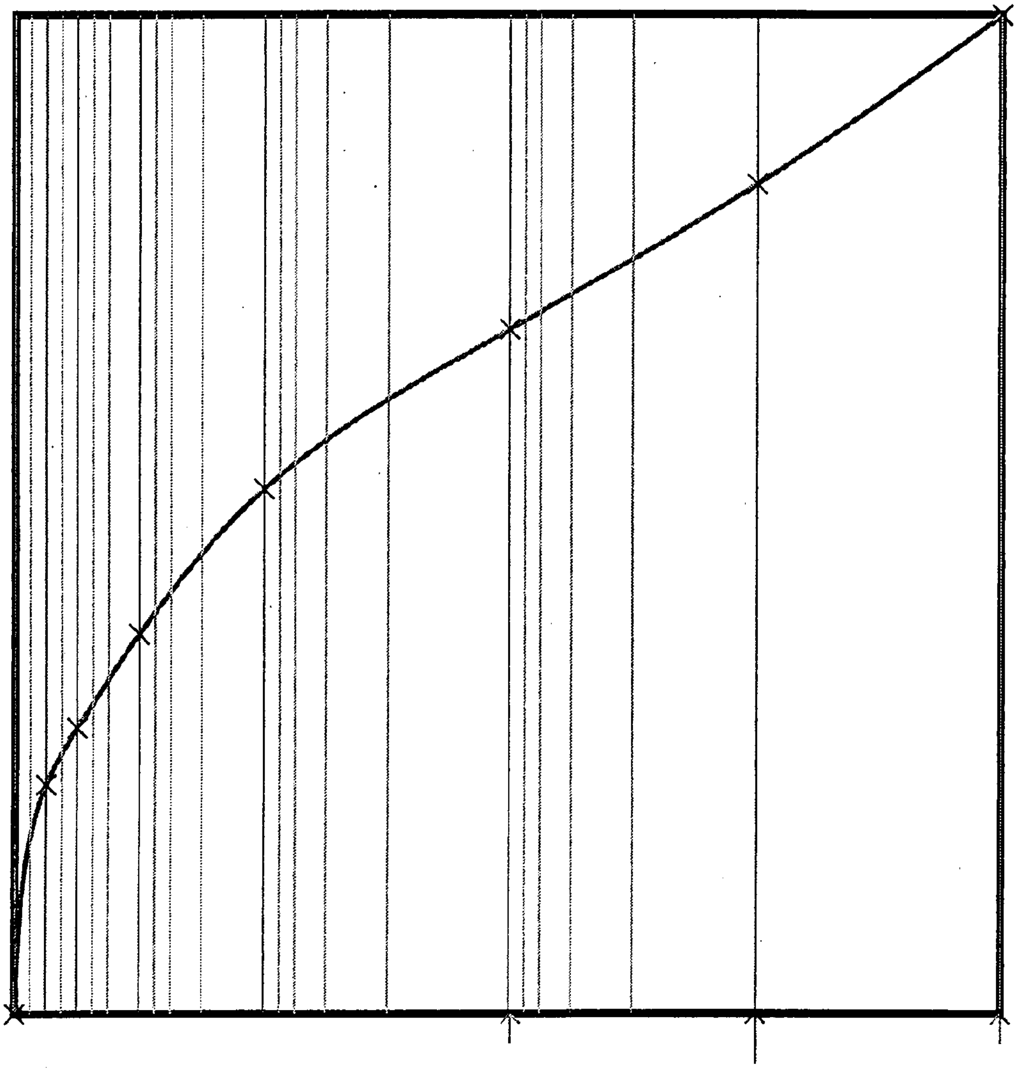
Figure 15K:
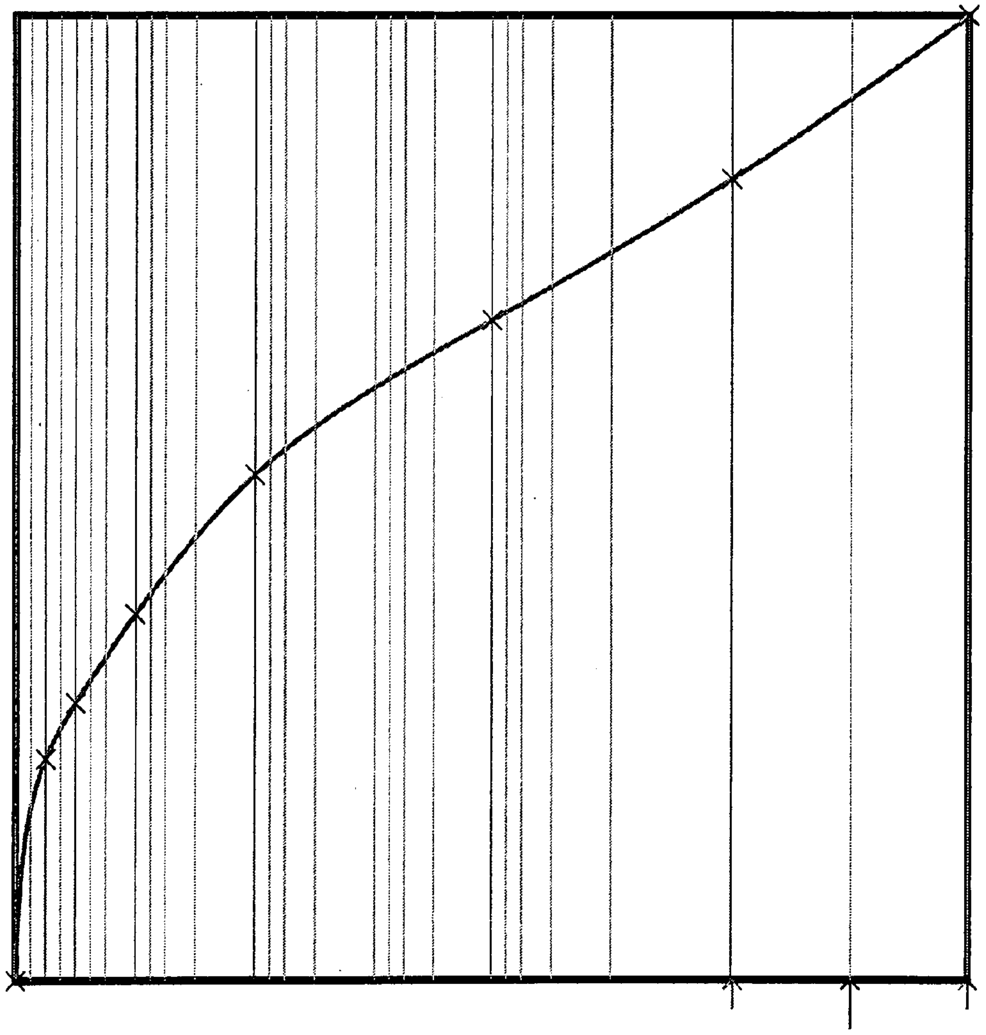
Figure 15L:
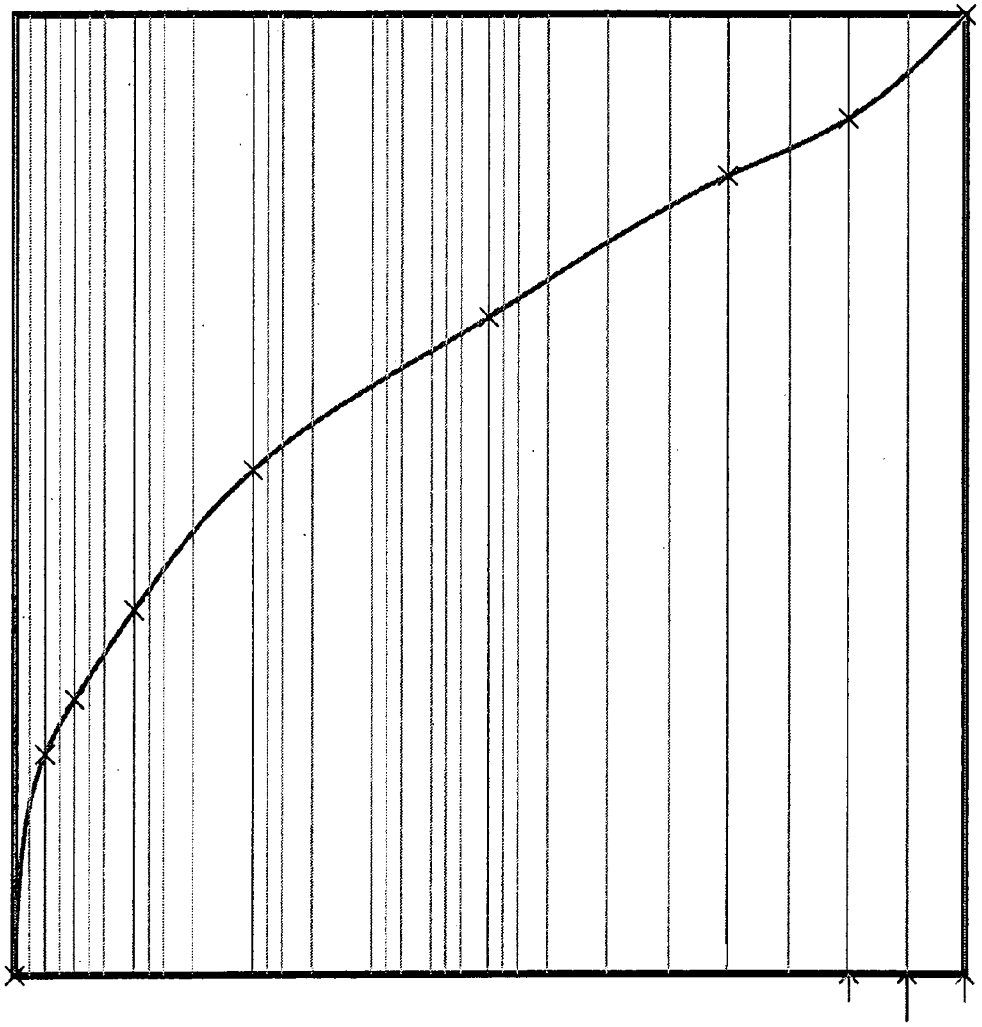

The approximating spline can be calculated as a cubic spline along an axis parallel to the diagonal line which represents a linear transfer function between the test input values and the display input values (FIG. 14). The approximating spline passes through the control points and may be smooth in the first derivative and may be continuous in the second derivative both between the control points and at the boundaries. The approximating spline can be used to interpolate any test input value to a display input value.

To reiterate, test input values always pass through the approximating spline to determine a corresponding display input value, and then within the display, go through the display transfer function to produce a corresponding perceived brightness output.

At this stage there are two input/output relationships known: The minimum test input value corresponds to the darkest display input value which corresponds to the lowest perceived brightness output, and the maximum test input value corresponds to the lightest display input value which corresponds to the highest perceived brightness output.

In the preferred embodiment, visual test patterns are made up of two areas, the first area consisting of a single brightness, and the second being made up of equal areas of two different brightness outputs arranged in such a way that they blend into a single brightness output when viewed at a distance. These two areas are also presented on the display in a way that allows easy comparison between their perceived brightness outputs.

A test point contains the data necessary to create a visual test pattern.

Test point candidates are made from every unique pair of control points. The pair of control points that make a test point are referred to as the test point's parents.

The test point consists of the test input values of the two parent control points, as well as the test input value at a point halfway between the two parents' control points' test input values. The test point's test input value is at this halfway point.

In the first pass, there are only two control points 136, 138, one at the minimum test input value which maps to the darkest display input value and the other at the maximum test input value which maps to the lightest display input value. This represents three unique combinatorial pairs of control points: minimum test input value with minimum test input value, minimum test input value with maximum test input value, and maximum test input value with maximum test input value. And so three test point candidates 136, 138, 140 are created.

Test point candidates are sorted into test input value order. Test point candidates which have derived from two instances of the same parent are marked as viewable but not editable, since all of their values match and have previously been evaluated. As more control points are created, some pairs of control points will represent test points which have redundant test input values, since the midpoints of their parents will be the same. In this case, test points whose parents' test input values are the farthest apart are preferentially kept. Lastly, the density of test points is culled by defining a minimum test input value spacing requirement for accepting a test point candidate as a test point.

The user is allowed to select any test point to view its visual test pattern.

Test points make visual test patterns by passing both of the test point's parents' test input values through the approximating spline to get display input values. These two display input values are displayed in a pattern with equal proportions that blends into a single display brightness output when viewed from a distance. Adjacent to this, the single value of the test point's test input value is also passed through the approximating spline to get its estimated display input value.

When the user views a test point's visual test pattern, if the test point's estimated display input value was accurate, the visual test pattern will look homogeneous.

If the visual test pattern is perceived as heterogeneous, the user can act to modify its appearance. When this occurs a new control point is created, and the user adjusts the approximating spline at this test input value until the display input value creates a homogeneous looking pattern.

This process of validating the homogeneity of appearance of the visual test pattern at each test point, identifying the test point at which the visual test pattern is most heterogeneous, creating a new approximating spline control point, and adjusting this control point for homogeneity continues until the user is satisfied with the homogeneity at all test points.

After the characterization steps described above, the approximating spline will represent the transfer function necessary to linearize the display transfer function to the accuracy the user was willing to adjust visual test patterns. The relationship between the test input values and the perceived brightness outputs after characterization is linear.

Having this characterization and utilizing a complete calibration solution, the user could then choose a desired color balance and target display transfer function, then pass those values through the approximating spline as test input values, which will produce a range of display input values that represent a compensating transfer function. This compensating transfer function, when applied before the display, will result in the display exhibiting the targeted behavior. The target display transfer function is stretched or shrunk to fit the displayable dynamic range of the display.

Although the invention has been described with reference to a particular embodiment, this description is not meant to be construed in a limiting sense. Various modifications of the disclosed embodiments as well as alternative embodiments of the invention will become apparent to persons skilled in the art upon reference to the description of the invention. It is therefore contemplated that the appended claims will cover any such modifications or embodiments that fall within the scope of the invention.

We claim:

1. A method of characterizing a display having an arbitrary monotonic transfer function, comprising:

a. generating an approximating spline through a plurality of control points using the steps of:

1. providing at least two known control points, wherein each control point has a display input value;
2. fitting a spline through the known control points;
3. creating a test point candidate list from combinations of the control points, wherein each test point candidate has a display input value, and has at least two parents selected from the known control points;
4. selecting a test point from the test point candidate list, and displaying the test point on a display;
5. generating a visual test pattern on the display using the test point's parents;
6. performing a visual comparison at the selected test point by adjusting the display input value of the test point until a perceptual match is made between the displayed test point and the displayed visual test pattern;
7. accepting an adjusted test point as a new known control point; and
8. repeating steps 2 through 7 at least once for further refinement of the approximating spline.

2. The method of claim 1 wherein the display input value of each test point is estimated by interpolating the value of the approximating spline at the test input value.

3. The method of claim 1 wherein an adjustable range of the display input value of the test point in step 6 has a lower limit of the display input value of the control point whose test input value is closest to the test input value of the test point without being greater than the test input value of the test point, and has an upper limit of the display input value of the control point whose test input value is closest to the test input value of the test point without being less than the test input value of the test point.

4. The method of claim 1 wherein a user selects a test point candidate from the test point candidate list.

5. The method of claim 1 wherein test point candidates are culled from the test point candidate list to reduce the number of test point candidates.

6. The method of claim 1 wherein, when two test point candidates coincide, the test point candidate with the parents furthest apart is chosen.

7. The method of claim 1 wherein a test point candidates may only be selected from a pre-determined test point candidate list.

8. The method of claim 1 wherein a sequence of test points is pre-determined.

9. The method of claim 1 wherein the steps are repeated for each of at least two color channels of the display device.

10. The method of claim 9 wherein the color channels of the display device are red, green and blue.

11. The method of claim 1 wherein the characterizing is performed simultaneously for all color channels of the display device by:

a. adjusting luminance level and chrominance values; and b. converting the luminance level and chrominance values to changes in each color channel.

12. The method of claim 11 wherein the color channels of the display device are red, green and blue color channels.

13. The method of claim 1 wherein one of the known control points corresponds to the darkest display input value.

14. The method of claim 1 wherein one of the known control points corresponds to the lightest display input value.

15. The method of claim 1 wherein two of the known control points correspond to the darkest display input value and the lightest display input value.

16. The method of claim 1 wherein the candidate test point list is created from combinations of control points whose test input values have been have been quantized to realizable discrete values and the display input values of the control points corresponding to these discrete values have been interpolated along the approximating spline.

17. The method of claim 1 wherein, in step 6, the comparison of the test point is made using a hardware device capable of relative comparisons.

* * * * *